US012757463B2

(12) United States Patent
Seol et al.

(10) Patent No.: US 12,757,463 B2
(45) Date of Patent: Oct. 6, 2026

(54) SEMICONDUCTOR DEVICE INCLUDING TWO-DIMENSIONAL MATERIAL AND METHOD OF FABRICATING THE SAME

(71) Applicant: Samsung Electronics Co., Ltd., Suwon-si (KR)

(72) Inventors: Minsu Seol, Suwon-si (KR); Junyoung Kwon, Suwon-si (KR); Keunwook Shin, Suwon-si (KR); Minseok Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 536 days.

(21) Appl. No.: 18/350,433

(22) Filed: Jul. 11, 2023

(65) Prior Publication Data

US 2024/0021679 A1 Jan. 18, 2024

(30) Foreign Application Priority Data

Jul. 12, 2022 (KR) ........................ 10-2022-0085872

(51) Int. Cl.
*H10D 62/80* (2025.01)
*H10D 30/43* (2025.01)
(Continued)

(52) U.S. Cl.
CPC ............. *H10D 62/80* (2025.01); *H10D 30/43* (2025.01); *H10D 30/6212* (2025.01);
(Continued)

(58) Field of Classification Search
CPC ...... H10D 62/80; H10D 30/675; H10D 30/47; H10D 30/481; H10D 30/017;
(Continued)

(56) References Cited

U.S. PATENT DOCUMENTS 7,968,674 B2 6/2011 Choi et al.
7,988,941 B2 8/2011 Choi et al.
(Continued)

FOREIGN PATENT DOCUMENTS

CN 105023950 A 11/2015
CN 114695575 A * 7/2022 ................ G01J 1/42
(Continued)

OTHER PUBLICATIONS

Kim Kwanpyo et al, "Selective metal deposition at graphene line defects by atomic layer deposition", Nature Communications, vol. 5, No. 1, (Dec. 17, 2014), XP093107713 (Year: 2014).*
(Continued)

*Primary Examiner* — Vincent Wall
(74) *Attorney, Agent, or Firm* — Harness, Dickey & Pierce, P.L.C.

(57) ABSTRACT

A semiconductor device may include a two-dimensional material layer including a two-dimensional semiconductor material having a polycrystalline structure; metallic nanoparticles partially on the two-dimensional material layer; a source electrode and a drain electrode respectively on both sides of the two-dimensional material layer; and a gate insulating layer and a gate electrode on the two-dimensional material layer between the source electrode and the drain electrode.

20 Claims, 23 Drawing Sheets

(51) Int. Cl.

| | |
|---|---|
| ***H10D 30/62*** | (2025.01) |
| ***H10D 30/67*** | (2025.01) |
| ***H10D 62/40*** | (2025.01) |
| ***H10D 99/00*** | (2025.01) |

(52) U.S. Cl.
CPC ......... *H10D 30/6757* (2025.01); *H10D 99/00* (2025.01); *H10D 62/40* (2025.01)

(58) Field of Classification Search
CPC ............ H10D 62/8281; H10D 62/881; H10D 62/882; H10D 62/883
See application file for complete search history.

(56) References Cited

U.S. PATENT DOCUMENTS

| | | | |
|---|---|---|---|
| 8,133,466 | B2 | 3/2012 | Shin et al. |
| 8,283,038 | B2 | 10/2012 | Choi et al. |
| 8,535,553 | B2 | 9/2013 | Kong et al. |
| 8,623,761 | B2 | 1/2014 | Bonilla et al. |
| 8,723,024 | B2 | 5/2014 | Choi et al. |
| 8,895,433 | B2 | 11/2014 | Bonilla et al. |
| 8,906,787 | B2 | 12/2014 | Park et al. |
| 8,912,530 | B2 | 12/2014 | Yang et al. |
| 9,040,957 | B2 | 5/2015 | Lee et al. |
| 9,064,777 | B2 | 6/2015 | Heo et al. |
| 9,108,848 | B2 | 8/2015 | Woo et al. |
| 9,324,634 | B2 | 4/2016 | Bao et al. |
| 9,324,635 | B2 | 4/2016 | Bao et al. |
| 9,359,211 | B2 | 6/2016 | Woo et al. |
| 9,425,324 | B2 | 8/2016 | Diaz et al. |
| 9,472,450 | B2 | 10/2016 | Bonilla et al. |
| 9,527,043 | B2 | 12/2016 | Choi et al. |
| 9,533,265 | B2 | 1/2017 | Choi et al. |
| 9,583,358 | B2 | 2/2017 | Kim et al. |
| 9,721,734 | B2 | 8/2017 | Ryu et al. |
| 10,325,987 | B2 | 6/2019 | Park et al. |
| 11,239,342 | B2 | 2/2022 | Cheng et al. |
| 2011/0127471 | A1 | 6/2011 | Shin et al. |
| 2013/0059155 | A1 | 3/2013 | Choi et al. |
| 2014/0087191 | A1 | 3/2014 | Chua et al. |
| 2015/0235959 | A1 | 8/2015 | Lee et al. |
| 2016/0190244 | A1 | 6/2016 | Lee et al. |
| 2018/0019347 | A1 | 1/2018 | Youn et al. |
| 2020/0350252 | A1 | 11/2020 | Shin et al. |
| 2021/0296445 | A1 | 9/2021 | Lee et al. |
| 2022/0077321 | A1 | 3/2022 | Seol et al. |
| 2022/0367207 | A1 | 11/2022 | Chuu et al. |
| 2023/0031861 | A1 | 2/2023 | Lee et al. |
| 2024/0030294 | A1 | 1/2024 | Seol et al. |

FOREIGN PATENT DOCUMENTS

| | | | |
|---|---|---|---|
| KR | 10-1559292 | B1 | 10/2015 |
| KR | 10-2016-0081102 | A | 7/2016 |
| KR | 10-2016-0124958 | A | 10/2016 |
| KR | 10-2018-0074857 | A | 7/2018 |
| KR | 10-2020-0126925 | A | 11/2020 |
| KR | 10-2021-0086927 | A | 7/2021 |
| KR | 10-2021-0094332 | A | 7/2021 |
| KR | 10-2021-0117004 | A | 9/2021 |
| KR | 10-2022-0031366 | A | 3/2022 |
| WO | WO-2018/009931 | A1 | 1/2018 |

OTHER PUBLICATIONS

CN114695575 machine translation (Year: 2026).*

Extended European Search Report dated Dec. 13, 2023 for corresponding European Patent Application No. 23184734.4.

Kim Kwanpyo et al, "Selective metal deposition at graphene line defects by atomic layer deposition", Nature Communications, vol. 5, No. 1, (Dec. 17, 2014), XP093107713.

Kim Minsu et al, "Highly Stable and Effective Doping of Graphene by Selective Atomic Layer Deposition of Ruthenium", Applied Materials & Interfaces, vol. 9, No. 1, (Jan. 11, 2017), pp. 701-709, XP093107724.

Korean Office Action dated Jan. 30, 2024 for corresponding Korean Patent Application No. 10-2022-0085872 and its English-language translation.

P. Man et. al. Functional Grain Boundaries in Two-Dimensional Transition-Metal Dichalcogenides, Acc. Chem. Res. Oct. 31, 2021, vol. 54, pp. 4191-4202.

Chris D. English et al., "Improved Contacts to MOS2 Transistors by Ultra-High Vacuum Metal Deposition," Nano Lett. 2016, 16, 3824-3830.

Younghun Jung et al., "Transferred via Contacts as a Platform for Ideal Two-Dimensional Transistors," Nat. Electron. 2019, 187-194.

Yan Wang et al., "Van Der Waals Contacts Between Three-Dimensional Metals and Two-Dimensional Semiconductors," Nature 2019.

Pin-Chun Shen et al., "Ultralow Contact Resistance Between Semimetal and Monolayer Semiconductors," Nature vol. 593, 2021.

Saien Xie et al., "Coherent, Atomically Thin Transition-Metal Dichalcogenide Superlattices With Engineered Strain," Science 359, 1131-1136 (2018).

* cited by examiner 0 cycles 25 cycles 55 cycles

SEMICONDUCTOR DEVICE INCLUDING TWO-DIMENSIONAL MATERIAL AND METHOD OF FABRICATING THE SAME

CROSS-REFERENCE TO RELATED APPLICATION

This application is based on and claims priority under 35 U.S.C. § 119 to Korean Patent Application No. 10-2022-0085872, filed on Jul. 12, 2022, in the Korean Intellectual Property Office, the disclosure of which is incorporated by reference herein in its entirety.

BACKGROUND

1. Field

The disclosure relates to a semiconductor device including a two-dimensional material and a method of fabricating the same.

2. Description of the Related Art

A transistor is a semiconductor device that performs an electrical switching function, and is used in various semiconductor products, such as memories and driving integrated circuits (ICs). When the size of semiconductor devices is reduced, more semiconductor devices may be integrated on one wafer and the driving speed of semiconductor devices is also increased. Therefore, studies have been actively conducted to reduce the size of semiconductor devices.

Recently, studies have been conducted to reduce the size of semiconductor devices by using two-dimensional materials. Two-dimensional materials have stable and excellent properties even at a small thickness of 1 nm or less. Therefore, two-dimensional materials attract attention as a material capable of overcoming the limitation of performance degradation due to a reduction in the size of semiconductor devices.

SUMMARY

Provided are a semiconductor device including a two-dimensional material and a method of fabricating the same.

Additional aspects will be set forth in part in the description which follows and, in part, will be apparent from the description, or may be learned by practice of the presented embodiments of the disclosure.

According to an embodiment, a semiconductor device may include a two-dimensional material layer including a two-dimensional semiconductor material having a polycrystalline structure; metallic nanoparticles partially on the two-dimensional material layer; a source electrode and a drain electrode respectively on both sides of the two-dimensional material layer; and a gate insulating layer and a gate electrode on the two-dimensional material layer between the source electrode and the drain electrode.

In some embodiments, the metallic nanoparticles may be on at least one of a defect of the two-dimensional semiconductor material and a grain boundary of the two-dimensional semiconductor material.

In some embodiments, the two-dimensional semiconductor material may include a material having a bandgap of 0.1 eV or more and 3.0 eV or less.

In some embodiments, the two-dimensional semiconductor material may include a transition metal dichalcogenide (TMD).

In some embodiments, the TMD may include a metal element and a chalcogen element. The metal element may include one of Mo, W, Nb, V, Ta, Ti, Zr, Hf, Tc, and Re. The chalcogen element may include one of S, Se, and Te.

In some embodiments, the two-dimensional semiconductor material may include black phosphorus.

In some embodiments, the two-dimensional material layer may include one to ten layers.

In some embodiments, the two-dimensional material layer may include one to five layers.

In some embodiments, the two-dimensional material layer may include a first region and a second region. The gate electrode may be on the first region of the two-dimensional material layer. The source electrode and the drain electrode may be on the second region of the two-dimensional material layer.

In some embodiments, the metallic nanoparticles may be on the first region of the two-dimensional material layer and the second region of the two-dimensional material layer at a substantially uniform density.

In some embodiments, the metallic nanoparticles may be on the second region the two-dimensional material layer at a higher density than a density of the metallic nanoparticles on the first region the two-dimensional material layer.

In some embodiments, the metallic nanoparticles only may be on the second region of the two-dimensional material layer.

In some embodiments, the metallic nanoparticles may include first metallic nanoparticles and second metallic nanoparticles. The first metallic nanoparticles may be on the first region of the two-dimensional material layer. The second metallic nanoparticles may be on the second region of the two-dimensional material layer. A material of the second metallic nanoparticles may be different from a material of the first metallic nanoparticles.

In some embodiments, the metallic nanoparticles may include Ru, RuO, Mo, W, Co, TiN, Ti, or Al.

In some embodiments, the metallic nanoparticles may include a material having a work function greater than a work function of the two-dimensional semiconductor material.

In some embodiments, the metallic nanoparticles may include a material having a work function less than a work function of the two-dimensional semiconductor material.

In some embodiments, an electronic device may include the semiconductor device.

According to an embodiment, a method of fabricating a semiconductor device may include forming a two-dimensional material layer on a substrate, the two-dimensional material layer including a two-dimensional semiconductor material having a polycrystalline structure; partially depositing metallic nanoparticles on the two-dimensional material layer; forming a gate insulating layer and a gate electrode on the two-dimensional material layer; and forming a source electrode and a drain electrode on both sides of the two-dimensional material layer, respectively.

In some embodiments, the two-dimensional semiconductor material may include a material having a bandgap of 0.1 eV or more and 3.0 eV or less.

In some embodiments, the two-dimensional semiconductor material may include transition metal dichalcogenide (TMD) or black phosphorus.

In some embodiments, the two-dimensional material layer may include one to ten layers.

In some embodiments, the metallic nanoparticles may be deposited by atomic layer deposition (ALD) or chemical vapor deposition (CVD).

In some embodiments, the metallic nanoparticles may be selectively deposited on at least one of a defect of the two-dimensional semiconductor material and a grain boundary of the two-dimensional semiconductor material.

In some embodiments, the two-dimensional material layer may include a first region and a second region. The gate electrode may be on the first region of the two-dimensional material layer. The source electrode and the drain electrode may be on the second region of the two-dimensional material layer.

In some embodiments, the metallic nanoparticles may be deposited on the first region of the two-dimensional material layer and the second region of the two-dimensional material layer at a substantially uniform density.

In some embodiments, the metallic nanoparticles may be deposited on the second region of the two-dimensional material layer at a higher density than a density in which the metallic nanoparticles are deposited on the first region of the two-dimensional material layer.

In some embodiments, the metallic nanoparticles may be deposited only on the second region of the two-dimensional material layer.

In some embodiments, the metallic nanoparticles may include first metallic nanoparticles and second metallic nanoparticles. The first metallic nanoparticles may be deposited on the first region of the two-dimensional material layer. The second metallic nanoparticles may be deposited on the second region of the two-dimensional material layer, and a material of the second metallic nanoparticles may be different from a material of the first metallic nanoparticles.

In some embodiments, the metallic nanoparticles may include Ru, RuO, Mo, W, Co, TiN, Ti, or Al.

In some embodiments, the metallic nanoparticles may include a material having a work function greater than a work function of the two-dimensional semiconductor material, or the work function of the material in the metallic nanoparticles may be less than the work function of the two-dimensional semiconductor material.

According to an embodiment, a semiconductor device may include a two-dimensional material layer including a two-dimensional semiconductor material having a polycrystalline structure; metallic nanoparticles on a surface of the two-dimensional material layer, the metallic nanoparticles including a first group of the metallic nanoparticles and a second group of the metallic nanoparticles; a source electrode and a drain electrode spaced apart from each other on the surface of the two-dimensional material layer, the source electrode on the first group of the metallic nanoparticles, and the drain electrode on the second group of the metallic nanoparticles; a gate insulating layer on the surface of the two-dimensional material layer; and a gate electrode on gate insulating layer between the source electrode and the drain electrode. The gate electrode may be spaced apart from the source electrode and the drain electrode.

In some embodiments, the two-dimensional semiconductor material may include a transition metal dichalcogenide (TMD) or black phosphorous.

In some embodiments, the metallic nanoparticles may include Ru, RuO, Mo, W, Co, TiN, Ti, or Al.

In some embodiments, the metallic nanoparticles may include a third group of the metallic nanoparticles between the first group of the metallic nanoparticles and the second group of the metallic nanoparticles, and the gate insulating layer may be on the third group of the metallic nanoparticles.

In some embodiments, an electronic device may include the semiconductor device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
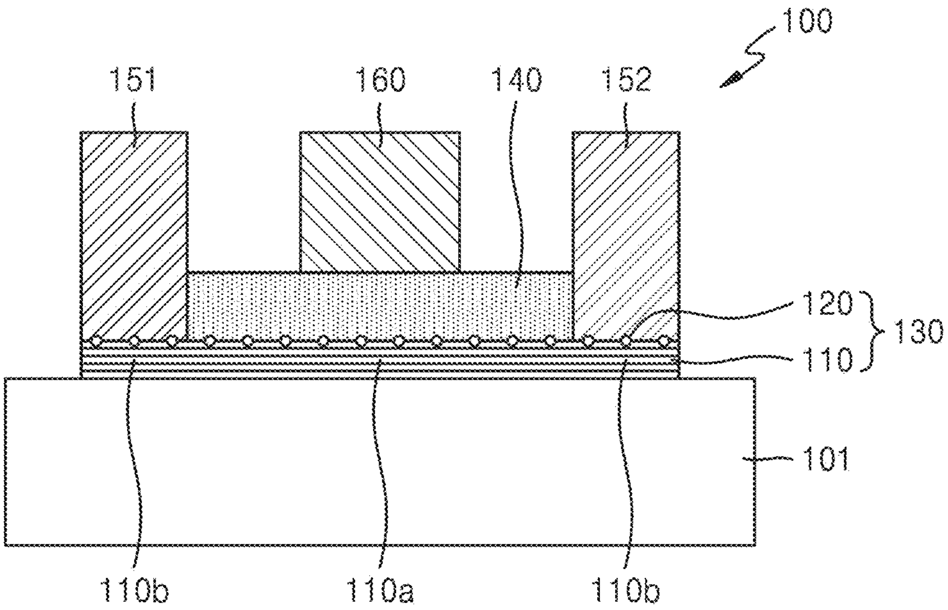
FIG. 1 is a cross-sectional view of a semiconductor device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, embodiments will be described in detail with reference to the accompanying drawings. In the following drawings, the same reference numerals denote the same elements, and the size of each element in the drawings may be exaggerated for clarity and convenience of explanation. Embodiments described herein are merely examples, and various modifications may be made thereto from these embodiments.

Hereinafter, the terms "above" or "on" may include not only those that are directly above, below, left, or right in a contact manner, but also those that are above, below, left, or right in a non-contact manner. The singular forms "a," "an," and "the" as used herein are intended to include the plural forms as well unless the context clearly indicates otherwise. It will be understood that the terms "comprise," "include," or "have" as used herein specify the presence of stated elements, but do not preclude the presence or addition of one or more other elements.

The use of the term "the" and similar demonstratives may correspond to both the singular and the plural. Steps constituting methods may be performed in any suitable order unless otherwise indicated herein or otherwise clearly contradicted by context, and are not necessarily limited to the stated order.

Also, the terms such as " . . . er/or" and "module" described in the specification mean units that process at least one function or operation, and may be implemented as hardware, software, or a combination of hardware and software.

Connecting lines or connecting members illustrated in the drawings are intended to represent exemplary functional relationships and/or physical or logical connections between the various elements. It should be noted that many alternative or additional functional relationships, physical connections or logical connections may be present in a practical device.

The use of all illustrations or illustrative terms in the embodiments is simply to describe the embodiment in detail, and the scope of the disclosure is not limited due to the illustrations or illustrative terms unless they are limited by claims.

FIG. 1 is a cross-sectional view of a semiconductor device 100 according to an embodiment. The semiconductor device 100 illustrated in FIG. 1 may be, for example, a field effect transistor (FET).

Referring to FIG. 1, a channel layer 130 is provided on a substrate 101. The substrate 101 may include various materials, such as a semiconductor material, an insulating material, or a metal material. When a two-dimensional material layer 110 to be described below is formed by depositing a two-dimensional semiconductor material on the substrate 101, the substrate 101 may be a substrate for growth of the two-dimensional semiconductor material.

The channel layer 130 may include a two-dimensional material layer 110 provided on the substrate 101 and metallic nanoparticles 120 partially deposited on the two-dimensional material layer 110.

The two-dimensional material layer 110 may include a two-dimensional semiconductor material having a polycrystalline structure. The two-dimensional semiconductor material refers to a two-dimensional material having a layered structure in which constituent atoms are two-dimensionally bonded. The two-dimensional semiconductor material may have excellent electrical properties and may maintain high mobility without significant change in properties thereof even when the thickness thereof is reduced to a nanoscale.

The two-dimensional semiconductor material may include a material having a bandgap of about 0.1 eV or more and about 3.0 eV or less. For example, the two-dimensional semiconductor material may include transition metal dichalcogenide (TMD) or black phosphorus. However, the disclosure is not limited thereto.

The TMD is a two-dimensional material having semiconductor properties and is a compound of a transition metal and a chalcogen element. The transition metal may include, for example, at least one of Mo, W, Nb, V, Ta, Ti, Zr, Hf, Co, Tc, and Re, and the chalcogen element may include, for example, at least one of S, Se, and Te. As a specific example, the TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, and the like. However, the disclosure is not limited thereto. The black phosphorus is a semiconductor material having a structure in which phosphorus (P) atoms are two-dimensionally bonded.

The two-dimensional semiconductor material may be doped with a p-type dopant or an n-type dopant in order to control mobility. The two-dimensional material layer 110 may have a monolayer or multilayer structure, and each layer may have an atomic level thickness. The two-dimensional material layer 110 may include, for example, one to ten layers. As a specific example, the two-dimensional material layer 110 may include one to five layers. However, the disclosure is not limited thereto.

The two-dimensional material layer 110 may include a first region 110*a* and a second region 110*b* respectively on both sides of the first region 110*a*. The first region 110*a* may be located in the central portion of the two-dimensional material layer 110. The first region 110*a* may be a channel region corresponding to a gate electrode 160 to be described below. The second regions 110*b* may be respectively located on both sides of the two-dimensional material layer 110. The second regions 110*b* may be respectively a source region and a drain region provided to correspond to a source electrode 151 and a drain electrode 152 to be described below.

The metallic nanoparticles 120 are partially deposited on the upper surface of the two-dimensional material layer 110. The metallic nanoparticles 120 may be deposited on at least one of defects and grain boundaries of a two-dimensional semiconductor material having a polycrystalline structure.

Figure 2A:
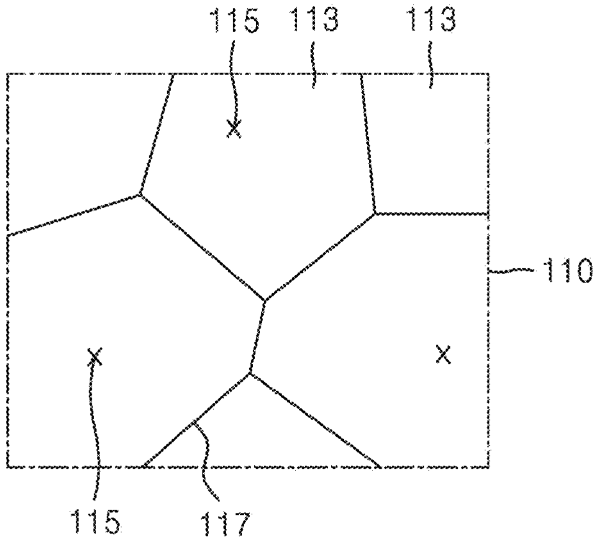
FIG. 2A is a diagram illustrating defects and grain boundaries formed in a two-dimensional material layer.

FIG. 2A is a plan view of the two-dimensional material layer 110 including a two-dimensional semiconductor material having a polycrystalline structure. Referring to FIG. 2A, defects 115 may be present inside crystal grains 113 in a two-dimensional semiconductor material having a polycrystalline structure, and grain boundaries 117 may be present between the crystal grains 113.

Figure 2B:
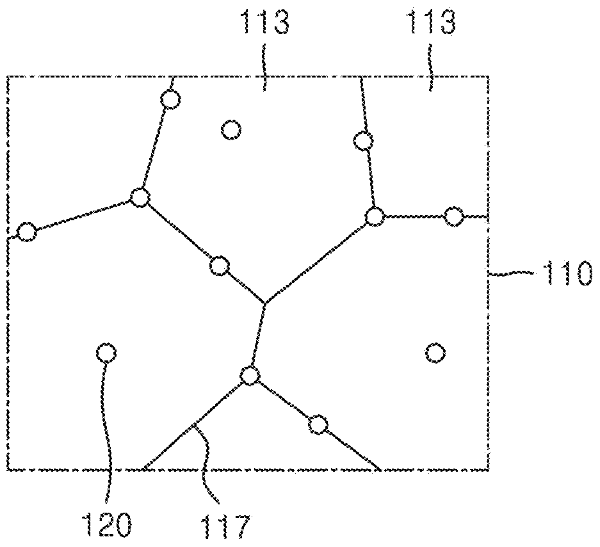
FIG. 2B is a diagram illustrating a state in which metallic nanoparticles are selectively deposited on defects and grain boundaries of the two-dimensional material layer illustrated in FIG. 2A.

FIG. 2B illustrates a state in which the metallic nanoparticles 120 are selectively deposited on the defects 115 and the grain boundaries 117 of the two-dimensional material layer 110 illustrated in FIG. 2A. As described below, when the metallic nanoparticles 120 are deposited on the two-dimensional material layer 110 by ALD or chemical vapor deposition (CVD), the metallic nanoparticles 120 may be selectively deposited only on the defects 115 and/or the grain boundaries 117 having dangling bonds.

The metallic nanoparticles 120 may include a material having excellent conductivity. The metallic nanoparticles 120 may include, for example, Ru, RuO, Mo, W, Co, TiN, Ti, or Al. However, the disclosure is not limited thereto.

The metallic nanoparticles 120 may include a material having a work function greater than a work function of the two-dimensional semiconductor material constituting the two-dimensional material layer 110. The metallic nanoparticles 120 may include, for example, Ru, RuO, Mo, W, Co, or the like, but this is only an example. In this case, the two-dimensional material layer 110 may have a p-type channel polarity.

The metallic nanoparticles 120 may include a material having a work function less than a work function of the two-dimensional semiconductor material constituting the two-dimensional material layer 110. The metallic nanoparticles 120 may include, for example, TiN, Ti, Al, or the like, but this is only an example. In this case, the two-dimensional material layer 110 may have an n-type channel polarity.

The metallic nanoparticles 120 may be deposited on the first and second regions 110*a* and 110*b* of the two-dimensional material layer 110 at a substantially uniform density. Specifically, the metallic nanoparticles 120 may be deposited on the surface of the first region 110*a* acting as the channel region and the surfaces of the second regions 110*b* acting as the source and drain regions at a uniform density as a whole. The surfaces of the second regions 110*b* may constitute a contact region between the source electrode 151 and the source region and a contact region between the drain electrode 152 and the drain region.

A gate insulating layer 140 and a gate electrode 160 are sequentially stacked on the first region 110*a* of the two-dimensional material layer 110 in this stated order. The gate insulating layer 140 may include, for example, silicon nitride, but is not limited thereto.

The gate electrode 160 may include a metal material or a conductive oxide. The metal material may include, for example, at least one selected from Au, Ti, TiN, TaN, W, Mo, WN, Pt, and Ni. The conductive oxide may include, for example, indium tin oxide (ITO), indium zinc oxide (IZO), or the like. However, this is only an example.

The source electrode 151 and the drain electrode 152 are respectively provided on both sides of the gate electrode 160. The source electrode 151 and the drain electrode 152 are respectively provided on the second regions 110*b* of the two-dimensional material layer 110, that is, the source region and the drain region. The source electrode 151 may be provided in contact with the source region of the two-dimensional material layer 110, and the drain electrode 152 may be provided in contact with the drain region of the two-dimensional material layer 110. The source electrode 151 and the drain electrode 152 may include, for example, a metal material having excellent electrical conductivity, such as Ag, Au, Pt, or Cu, but is not limited thereto.

In a conventional silicon (Si)-based semiconductor device, as a channel thickness decreases, mobility decreases and a threshold voltage distribution increases, and as a channel length decreases, performance degradation due to a short channel effect becomes severe. Accordingly, there is a limitation in reducing a size of a semiconductor device.

Because the semiconductor device 100 according to the present embodiment uses the two-dimensional semiconductor material as the channel, the semiconductor device 100 may have excellent performance even with a small thickness of 1 nm or less. In addition, a short channel effect may be reduced. Accordingly, the limitation of performance degradation due to the reduction in the size of the semiconductor device 100 may be overcome.

When the two-dimensional material layer includes a two-dimensional semiconductor material having a polycrystalline structure, defects may be formed inside grains and grain boundaries may be formed between the grains. Accordingly, when the two-dimensional semiconductor material having the polycrystalline structure is used as a channel material, defects or grain boundaries formed in the two-dimensional semiconductor material interfere with the movement of charges, thus causing a degradation in characteristics of the semiconductor device. For example, the semiconductor device may be degraded because a contact resistance increases in the source and drain regions of the two-dimensional material layer and on-current decreases in the channel region of the two-dimensional material layer due to an increase in channel resistance.

In the semiconductor device 100 according to the present embodiment, because the metallic nanoparticles 120 are selectively deposited on the two-dimensional material layer 110 constituting the channel layer, charges may move through the metallic nanoparticles 120, and thus, electrical conductivity of the two-dimensional material layer 110 may be improved. Accordingly, a contact resistance may increase in the source and drain regions of the two-dimensional material layer 110, and on-current may be improved due to a decrease in channel resistance in the channel region of the two-dimensional material layer 110. In addition, the doping degree of the two-dimensional material layer 110 may be controlled by adjusting the material type and/or the deposition amount of the metallic nanoparticles 120 selectively deposited on the two-dimensional material layer 110. Accordingly, the channel polarity, threshold voltage, on-current, off-current, and the like of the semiconductor device 100 may be controlled.

Figure 3A:
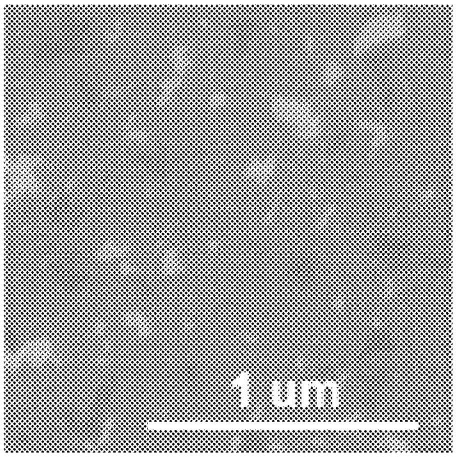
FIGS. 3A to 3C are scanning electron microscope (SEM) images of $MoS_2$ thin-films when Ru nanoparticles are deposited on the $MoS_2$ thin-films by atomic layer deposition (ALD) at 0 cycles, 25 cycles, and 55 cycles, respectively.
Figure 3B:
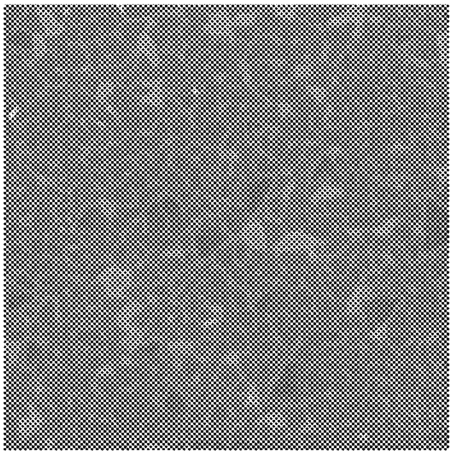
Figure 3C:
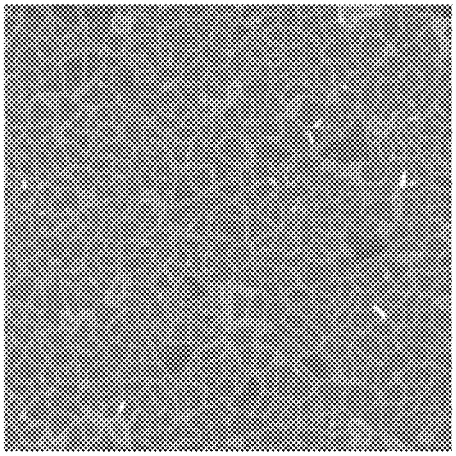

FIGS. 3A to 3C are scanning electron microscope (SEM) images of $MoS_2$ thin-films when Ru nanoparticles are deposited on the $MoS_2$ thin-films by ALD according to cycles, respectively.

FIG. 3A illustrates a polycrystalline $MoS_2$ thin-film on which Ru nanoparticles are not deposited, and FIGS. 3B and 3C illustrate a state when Ru nanoparticles are deposited on polycrystalline $MoS_2$ thin-films by ALD at 25 cycles and 55 cycles, respectively. Referring to FIGS. 3A to 3C, it may be confirmed that the amount of Ru nanoparticles selectively deposited on defects and grain boundaries of the polycrystalline $MoS_2$ thin-film increases as the deposition cycle increases.

Figure 4:
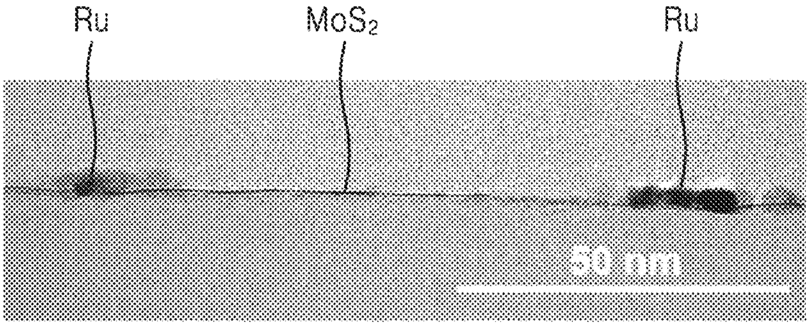
FIG. 4 is a transmission electron microscope (TEM) image of a cross-section of a $MoS_2$ thin-film when Ru nanoparticles are deposited on the $MoS_2$ thin-film by ALD at 25 cycles.

FIG. 4 is a transmission electron microscope (TEM) image of a cross-section of a $MoS_2$ thin-film when Ru nanoparticles are deposited on the $MoS_2$ thin-film by ALD at 25 cycles. Referring to FIG. 4, it may be confirmed that Ru nanoparticles are selectively deposited on defects and grain boundaries of the polycrystalline $MoS_2$ thin-film.

Hereinafter, a method of fabricating the semiconductor device 100 according to the above-described embodiment is described. FIGS. 5A to 5D are diagrams for describing a method of fabricating a semiconductor device, according to an embodiment.

Figure 5A:
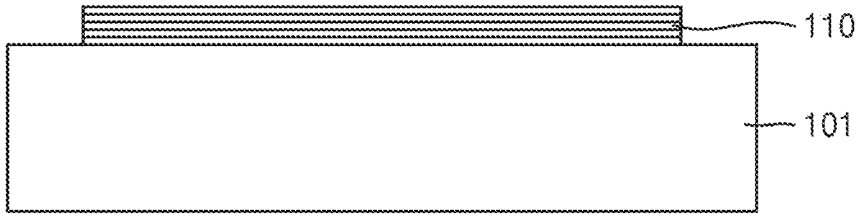
FIGS. 5A to 5D are diagrams for describing a method of fabricating a semiconductor device, according to an embodiment.

Referring to FIG. 5A, a two-dimensional material layer 110 is formed on a substrate 101. The two-dimensional material layer 110 includes a two-dimensional semiconductor material having a polycrystalline structure. The substrate 101 may include various materials, such as a semiconductor material, an insulating material, or a metal material. The two-dimensional material layer 110 may be formed by depositing and growing a two-dimensional semiconductor material on the surface of the substrate 101. The depositing of the two-dimensional semiconductor material 110 may be performed by, for example, CVD, physical vapor deposition (PVD), or the like, but this is only an example.

The two-dimensional semiconductor material may include a material having a bandgap of about 0.1 eV or more and about 3.0 eV or less. For example, the two-dimensional semiconductor material may include TMD or black phosphorus. However, the disclosure is not limited thereto.

The TMD is a two-dimensional material having semiconductor properties and is a compound of a transition metal and a chalcogen element. The transition metal may include, for example, at least one of Mo, W, Nb, V, Ta, Ti, Zr, Hf, Co, Tc, and Re, and the chalcogen element may include, for example, at least one of S, Se, and Te. As a specific example, the TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, and the like. However, the disclosure is not limited thereto. The black phosphorus is a semiconductor material having a structure in which phosphorus (P) atoms are two-dimensionally bonded. The two-dimensional semiconductor material may be doped with a p-type dopant or an n-type dopant in order to control mobility.

The two-dimensional material layer 110 may have a monolayer or multilayer structure, and each layer may have an atomic level thickness. The two-dimensional material layer 110 may include, for example, one to ten layers. As a specific example, the two-dimensional material layer 110 may include one to five layers. However, the disclosure is not limited thereto.

The two-dimensional material layer 110, which is deposited and grown on the substrate 101, may have a polycrystalline structure. In the two-dimensional material layer 110 having the polycrystalline structure, defects may be present inside the grains and grain boundaries may be present between the grains. The presence of the defects and the grain boundaries may interfere with the movement of charges.

Figure 5B:
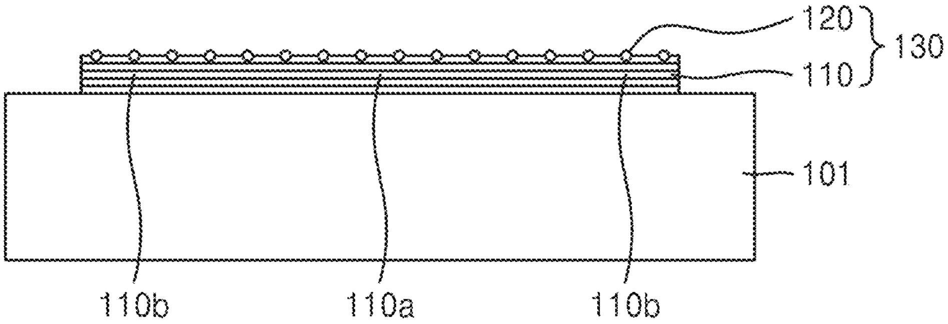

Referring to FIG. 5B, metallic nanoparticles 120 are selectively deposited on a certain portion of the two-dimensional material layer 110. Accordingly, a channel layer 130 including the two-dimensional material layer 110 and the metallic nanoparticles 120 is formed on the substrate 101. The depositing of the metallic nanoparticles 120 may be performed by, for example, ALD or CVD. In the depositing process, the metallic nanoparticles 120 may be selectively deposited only on the defects and/or the grain boundaries of the two-dimensional material layer 110. Specifically, the defects and the grain boundaries present in the two-dimensional material layer 110 having the polycrystalline structure have dangling bonds. In the depositing process, the metallic nanoparticles 120 may be selectively deposited only on the defects and the grain boundaries having dangling bonds. Accordingly, the movement of charges may be improved through the metallic nanoparticles 120, and electrical conductivity of the two-dimensional material layer 110 may be improved.

The metallic nanoparticles 120 may include a material having excellent conductivity. The metallic nanoparticles 120 may include, for example, Ru, RuO, Mo, W, Co, TiN, Ti, or Al. However, the disclosure is not limited thereto.

The metallic nanoparticles 120 may include a material having a work function greater than a work function of the two-dimensional semiconductor material constituting the two-dimensional material layer 110. The metallic nanoparticles 120 may include, for example, Ru, RuO, Mo, W, Co, or the like, but this is only an example. The metallic nanoparticles 120 may include a material having a work function less than a work function of the two-dimensional semiconductor material constituting the two-dimensional material layer 110. The metallic nanoparticles 120 may include, for example, TiN, Ti, Al, or the like, but this is only an example.

The two-dimensional material layer 110 may include a first region 110*a* located in the central portion of the two-dimensional material layer and second regions 110*b* respectively on both sides of the first region 110*a*. The first region 110*a* may be a channel region, and the second regions 110*b* may be source and drain regions. The metallic nanoparticles 120 may be formed to have a substantially uniform density in the entire region of the two-dimensional material layer.

Figure 5C:
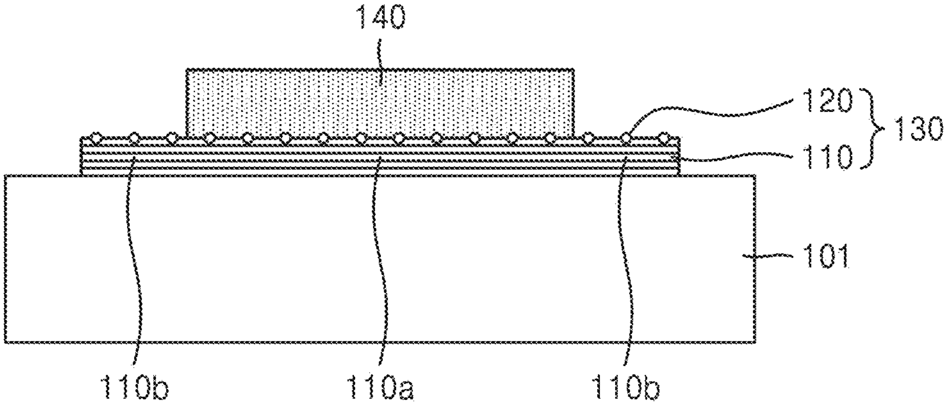

Referring to FIG. 5C, a gate insulating layer 140 is formed in the first region 110*a* of the two-dimensional material layer 110. The gate insulating layer 140 may include, for example, silicon nitride, but is not limited thereto.

Figure 5D:
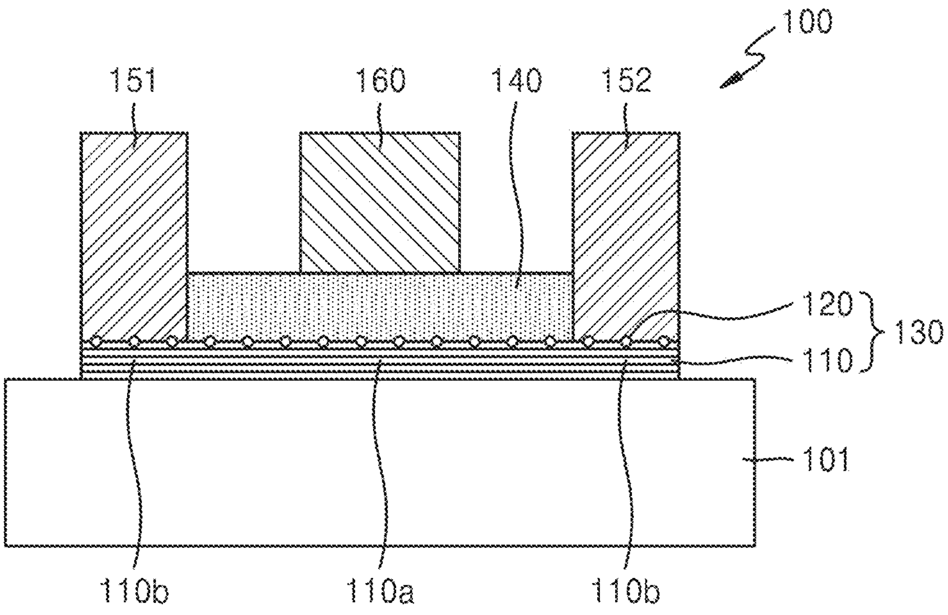

Referring to FIG. 5D, a gate electrode 160 is deposited on the gate insulating layer 140, and a source electrode 151 and a drain electrode 152 are respectively deposited on the second regions 110*b* of the two-dimensional material layer 110. The gate electrode 160 may be provided on the first region 110*a* of the two-dimensional material layer 110. The source electrode 151 and the drain electrode 152 are respectively provided on the second regions 110*b* of the two-dimensional material layer 110, that is, the source region and the drain region. The source electrode 151 may be provided in contact with the source region of the two-dimensional material layer 110, and the drain electrode 152 may be provided in contact with the drain region of the two-dimensional material layer 110.

A case where the metallic nanoparticles 120 are deposited on the entire first and second regions 110*a* and 110*b* of the two-dimensional material layer 110 at a substantially uniform density has been described above. However, this is only an example. For example, as described below, the metallic nanoparticles 120 may be deposited on the second region 110*b* at a higher density than on the first region 110*a*, or the metallic nanoparticles 120 may be deposited only on the second region 110*b*. In addition, first metallic nanoparticles may be deposited on the first region 110*a* and second metallic nanoparticles may be deposited on the second region 110*b*.

Figure 6:
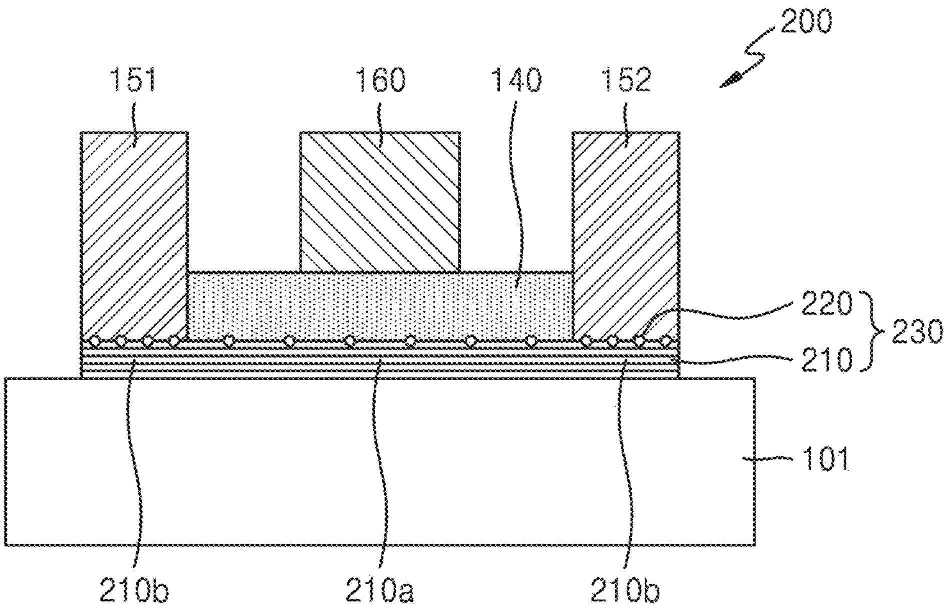
FIG. 6 is a cross-sectional view of a semiconductor device according to another embodiment.

FIG. 6 is a cross-sectional view of a semiconductor device 200 according to another embodiment. Hereinafter, differences from the above-described embodiment are mainly described.

Referring to FIG. 6, a channel layer 230 may include a two-dimensional material layer 210 provided on a substrate 101, and metallic nanoparticles 220 selectively deposited on a certain portion of the two-dimensional material layer 210. The metallic nanoparticles 220 may be selectively deposited only on defects and/or grain boundaries of the two-dimensional material layer 210. Because the two-dimensional material layer 210 and the metallic nanoparticles 220 have been described above, a detailed description thereof is omitted.

In the present embodiment, the metallic nanoparticles 220 may be deposited on second regions (source and drain regions) 210*b* at a higher density than on a first region (a channel region) 210*a* of the two-dimensional material layer 210. Specifically, the metallic nanoparticles 220 may be deposited at a relatively high density in contact regions of source and drain electrodes 151 and 152 and the source and drain regions 210*b*. In an ALD or CVD process, the metallic nanoparticles 220 with a controlled deposition amount may be deposited on desired regions of the two-dimensional material layer 210 by a photolithography process. Accordingly, the contact resistance between the source and drain electrodes 151 and 152 and the source and drain regions 210*b* may be further reduced, and off current in the channel region 210*a* may be prevented from increasing.

Figure 7:
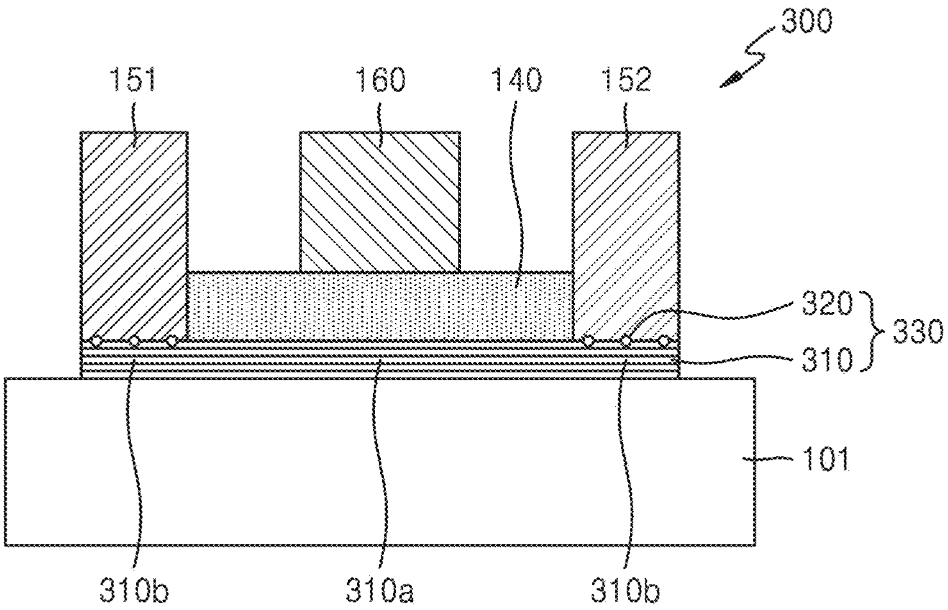
FIG. 7 is a cross-sectional view of a semiconductor device according to an embodiment.

FIG. 7 is a cross-sectional view of a semiconductor device 300 according to another embodiment.

Referring to FIG. 7, a channel layer 330 may include a two-dimensional material layer 310 provided on a substrate 101, and metallic nanoparticles 320 selectively deposited on a certain portion of the two-dimensional material layer 310. The metallic nanoparticles 320 may be selectively deposited only on defects and/or grain boundaries of the two-dimensional material layer 310.

In the present embodiment, the metallic nanoparticles 320 may be deposited only on second regions (source and drain regions) 310*b*, without being deposited on a first region (a channel region) 310*a* of the two-dimensional material layer 310. Specifically, the metallic nanoparticles 320 may be deposited only in contact regions of source and drain electrodes 151 and 152 and the source and drain regions 310*b*. In an ALD or CVD process, the metallic nanoparticles 320 may be deposited in desired regions of the two-dimensional material layer 310 by a photolithography process. Accordingly, the contact resistance between the source and drain electrodes 151 and 152 and the source and drain regions 310*b* may be further reduced, and an increase in off current in the channel region may be prevented.

FIGS. 8A to 8D are cross-sectional views of semiconductor devices according to some embodiments.

Figure 8A:
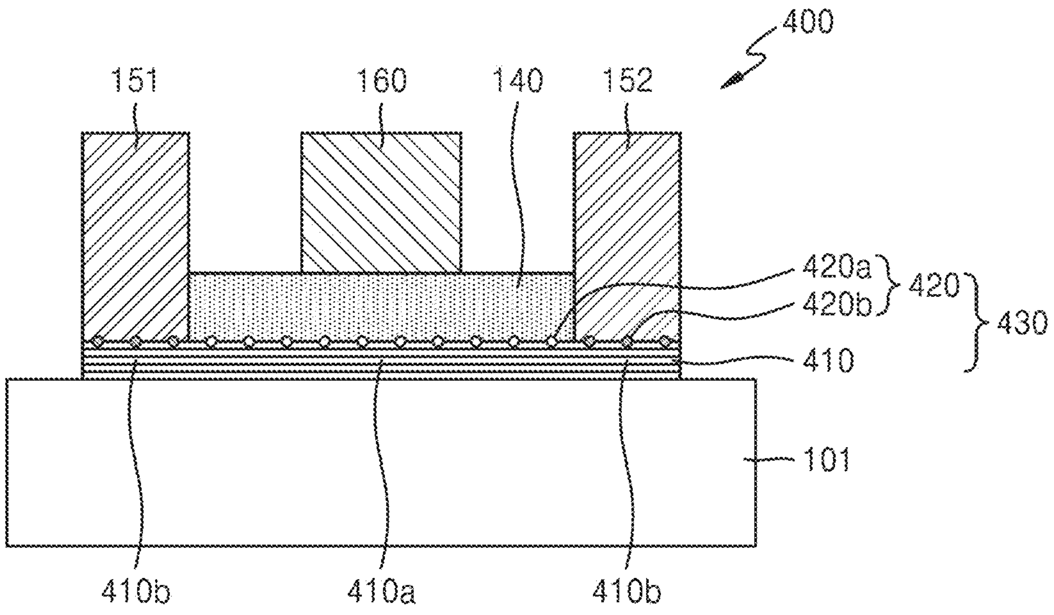
FIGS. 8A to 8D are cross-sectional views of semiconductor devices according to some embodiments.

Referring to FIG. 8A, in a semiconductor device 400 according to another embodiment, a channel layer 430 may include a two-dimensional material layer 410 provided on a substrate 101, and metallic nanoparticles 420 selectively deposited on a certain portion of the two-dimensional material layer 410. The metallic nanoparticles 420 may be selectively deposited only on defects and/or grain boundaries of the two-dimensional material layer 410.

In the present embodiment, the metallic nanoparticles 420 include first metallic nanoparticles 420*a* and second metallic nanoparticles 420*b* including a material that is different from the first metallic nanoparticles 420*a*. The first metallic nanoparticles 420*a* may be deposited on a first region (a channel region) 410*a* of the two-dimensional material layer 410, and the second metallic nanoparticles 420*b* may be deposited on second regions (source and drain regions) 410*b* of the two-dimensional material layer 410.

The difference in work function between the second metallic nanoparticles 420*b* and the two-dimensional material layer 410 deposited on the second region 410*b* may be greater than the difference in work function between the first metallic nanoparticles 420*a* and the two-dimensional material layers 410 deposited on the first region 410*a*. Accordingly, the contact resistance between source and drain electrodes 151 and 152 and the source and drain regions 410*b* may be further reduced, and off current in the channel region 210*a* may be prevented from increasing.

Figure 8B:
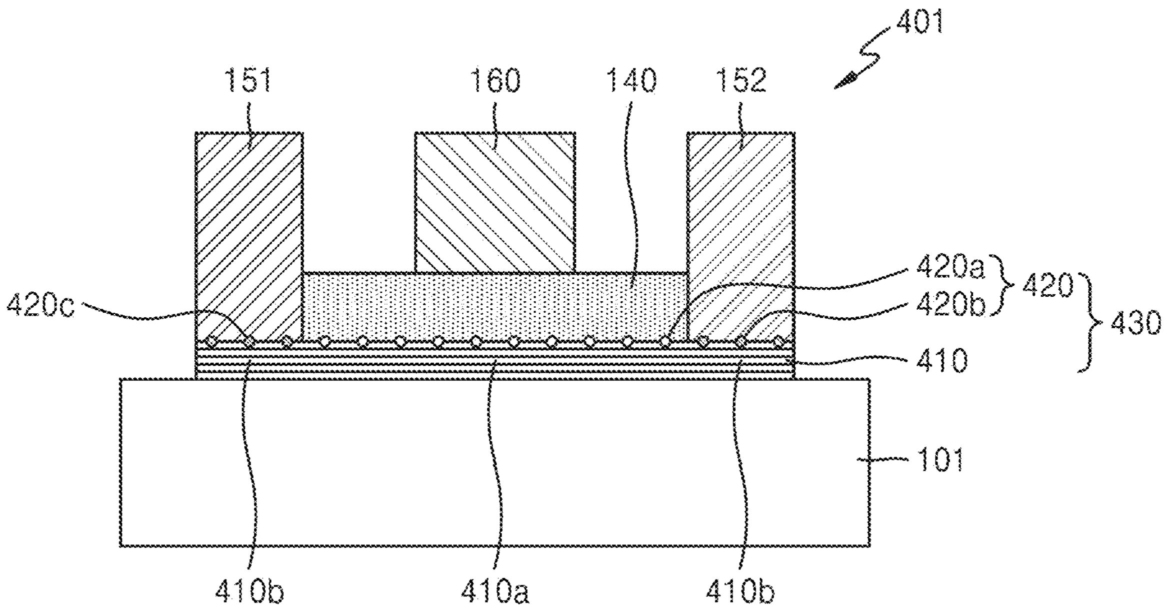

Referring to FIG. 8B, a semiconductor device 401 according to another embodiment may be the same as the semiconductor device 400 in FIG. 8A except third metallic nanoparticles 420*c* instead of the second metallic nanoparticles 420*b* may be deposited on a portion of the second region 410*b* of the two-dimensional material layer 410 under the source electrode 151. The semiconductor device 401 may include the second metallic nanoparticles 420*b* on the portion of the second region 410*b* of the two-dimensional material layer 410 under the drain electrode 152. The third metallic nanoparticles 420*c* may include a different material than a material of the second metallic nanoparticles 420*b* and a material of the first metallic nanoparticles 420*a*. The first to third metallic nanoparticles 420*a*, 420*b*, and 420*b* may includes different ones of Ru, RuO, Mo, W, Co, TiN, Ti, or Al, but example embodiments are not limited thereto.

Figure 8C:
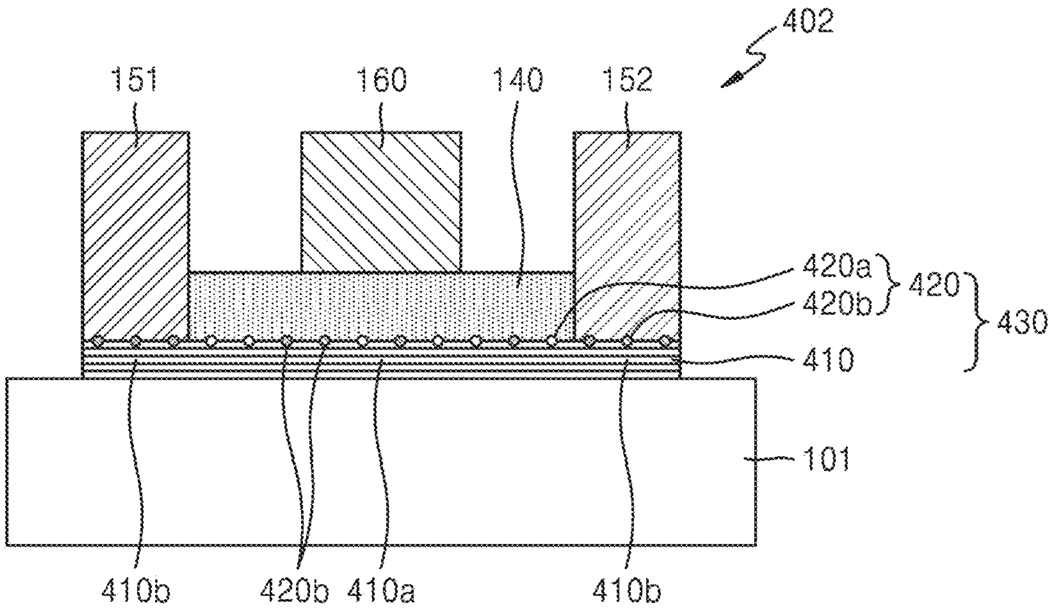

Referring to FIG. 8C, a semiconductor device 402 according to another embodiment may be the same as the semiconductor device 400 in FIG. 8A except both the first metallic nanoparticles 420*a* and the second metallic nanoparticles 420*b* may be deposited on the first region 410*a* of the two-dimensional material layer 410. In the semiconductor device 402, the first metallic nanoparticles 420*a* may not be deposited on the second region 410*b* of the two-dimensional material layer 410.

Figure 8D:
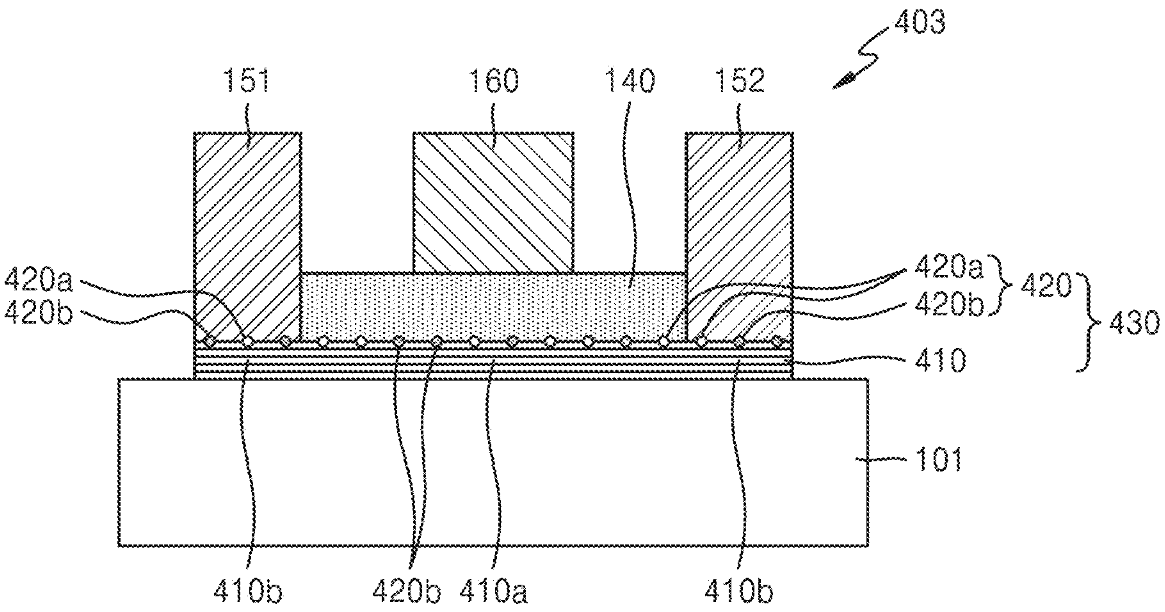

Referring to FIG. 8D, a semiconductor device 403 according to another embodiment may be the same as the semiconductor device 400 in FIG. 8A except both the first metallic nanoparticles 420*a* and the second metallic nanoparticles 420*b* may be deposited on the first region 410*a* and the second region 410*b* of the two-dimensional material layer 410.

In the embodiments described above, the semiconductor devices 100, 200, 300, 400, 401, 402, and 403 having a sheet channel structure have been exemplarily described. However, the disclosure is not limited thereto. For example, a semiconductor device having a fin channel structure (FinFET) or a semiconductor device having a gate-all-around channel structure (MBCFET; multi bridge channel FET) may be provided.

Figure 9:
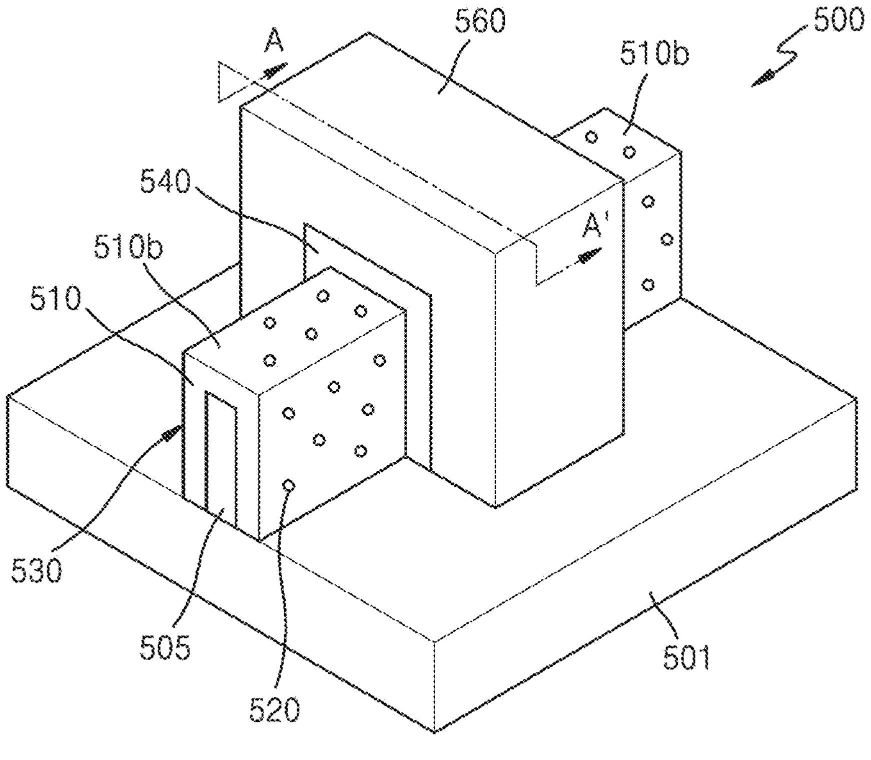
FIG. 9 is a perspective view illustrating a semiconductor device according to another embodiment.
Figure 10:
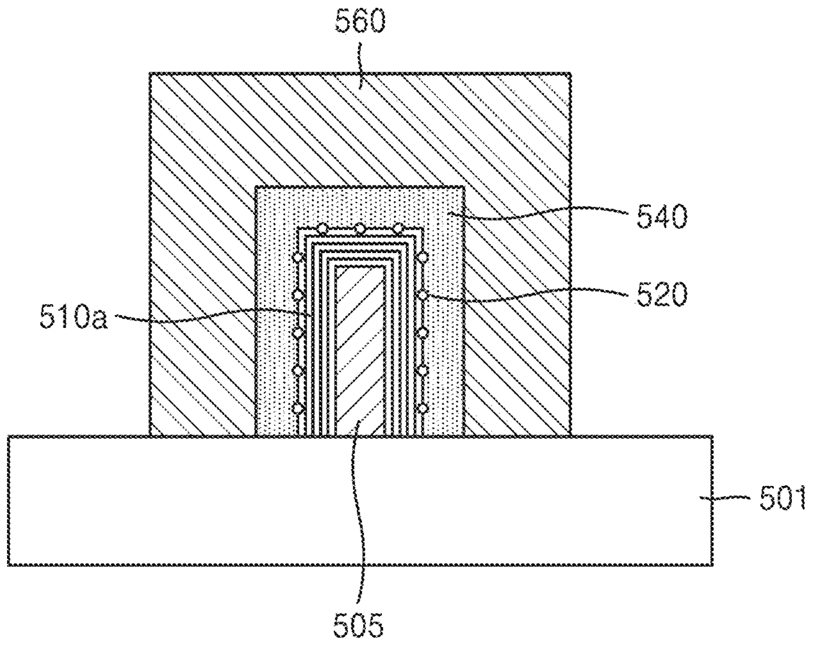
FIG. 10 is a cross-sectional view taken along line A-A' of FIG. 9.

FIG. 9 is a perspective view illustrating a semiconductor device (FinFET) 500 according to another embodiment, and FIG. 10 is a cross-sectional view taken along line A-A' of FIG. 9.

Referring to FIGS. 9 and 10, an insulator 505 is provided on a substrate 501 so as to be perpendicular to the substrate 501, and a channel layer 530 is provided to cover the insulator 505. The channel layer 530 may have a fin shape.

The channel layer 530 may include a two-dimensional material layer 510 and metallic nanoparticles 520 selectively deposited on a certain portion of the two-dimensional material layer 510. The metallic nanoparticles 520 may be selectively deposited only on defects and/or grain boundaries of the two-dimensional material layer 510. Because the two-dimensional material layer 510 and the metallic nanoparticles 520 have been described above, a detailed description thereof is omitted.

The two-dimensional material layer 510 may include a first region 510*a* and second regions 510*b* respectively on both sides of the first region 510*a*. The first region 510*a* may be a channel region located in the central portion of the two-dimensional material layer 510. The second regions 510*b* may be source and drain regions respectively on both sides of the two-dimensional material layer 510.

A gate insulating layer 540 is provided on the first region 510*a* of the two-dimensional material layer 510, and a gate electrode 560 is provided on the gate insulating layer 540. The gate insulating layer 540 may be provided to surround the channel layer 530, specifically three surfaces of the first region 510*a* of the two-dimensional material layer 510, and the gate electrode 560 may be provided to surround three surfaces of the gate insulating layer 540. On the other hand, although not illustrated, the source and drain electrodes may be respectively provided on the second regions 510*b* of the two-dimensional material layer 510.

The metallic nanoparticles 520 may be deposited on the first and second regions 510*a* and 510*b* of the two-dimensional material layer 510 at a substantially uniform density. The metallic nanoparticles 520 may be deposited on the second regions 510*b* at a higher density than on the first region 510*a* of the two-dimensional material layer 510. The metallic nanoparticles 520 may be deposited only on the second regions 510*b* of the two-dimensional material layer 510. First metallic nanoparticles may be deposited on the first region 510*a* of the two-dimensional material layer 510, and second metallic nanoparticles may be deposited on the second regions 510*b* of the two-dimensional material layer 510.

Figure 11:
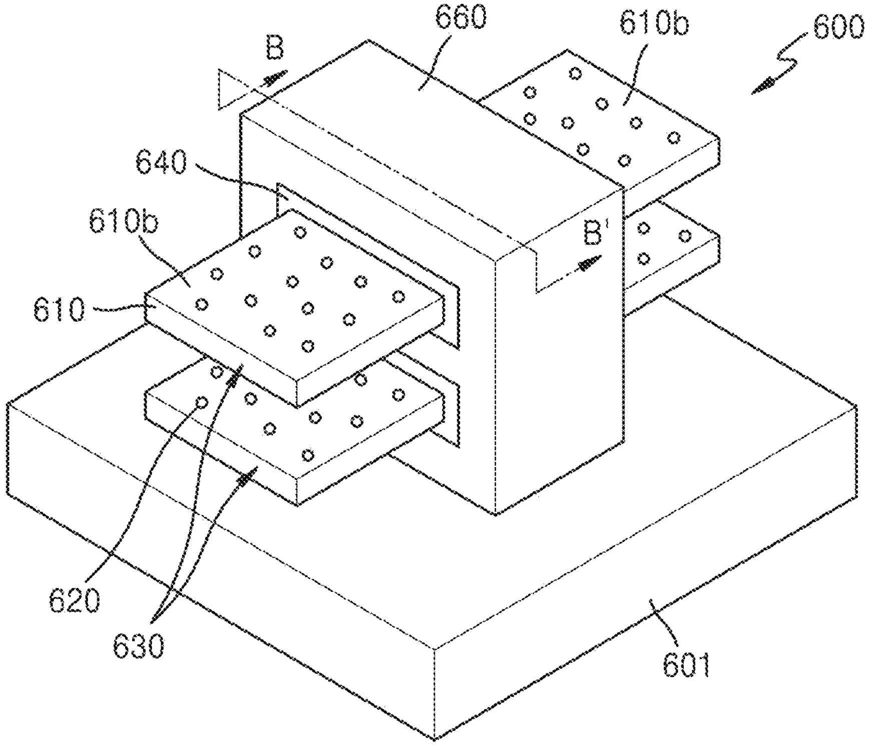
FIG. 11 is a perspective view of a semiconductor device according to another embodiment.
Figure 12:
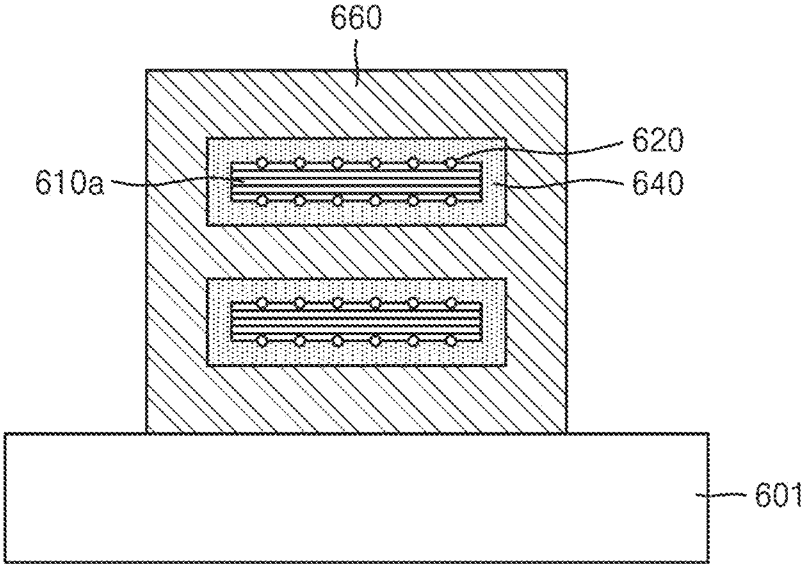
FIG. 12 is a cross-sectional view taken along line B-B' of FIG. 11.

FIG. 11 is a perspective view illustrating a semiconductor device (MBCFET) 600 according to another embodiment, and FIG. 12 is a cross-sectional view taken along line B-B' of FIG. 11.

Referring to FIGS. 11 and 12, at least one channel layer 630 is disposed over a substrate 601 so as to be spaced apart from the substrate 601. The at least one channel layer 630 may each have a sheet shape disposed in parallel to the substrate 601. FIGS. 11 and 12 illustrate a case where two channel layers 630 are vertically disposed over the substrate 601.

The two channel layers 630 may each include a two-dimensional material layer 610 and metallic nanoparticles 620 selectively deposited on a certain portion of the two-dimensional material layer 610. The metallic nanoparticles 620 may be selectively deposited only on defects and/or grain boundaries of the two-dimensional material layer 610. Because the two-dimensional material layer 610 and the metallic nanoparticles 620 have been described above, a detailed description thereof is omitted.

The two-dimensional material layer 610 may include a first region 610*a* and second regions 610*b* respectively on both sides of the first region 610*a*. The first region 610*a* may be a channel region located in the central portion of the two-dimensional material layer 610. The second regions 610*b* may be source and drain regions respectively on both sides of the two-dimensional material layer 610.

A gate insulating layer 640 is provided on the first region 610*a* of the two-dimensional material layer 610, and a gate electrode 660 is provided on the gate insulating layer 640. The gate insulating layer 640 may be provided to surround the channel layer 630, specifically four surfaces of the first region 610*a* of the two-dimensional material layer 610, and the gate electrode 660 may be provided to surround four surfaces of the gate insulating layer 640. Although not illustrated, the source and drain electrodes may be respectively provided on the second regions 610*b* of the two-dimensional material layer 610. On the other hand, an insulator (not illustrated) may be disposed over the substrate 601 in parallel to the substrate 601, and the channel layer 630 may be provided to surround the insulator.

The semiconductor devices 100, 200, 300, 400, 401, 402, 403, 500, and 600 described above may be applied to, for example, a memory device, such as dynamic random access memory (DRAM). The memory device may have a structure in which each of the semiconductor devices 100, 200, 300, 400, 401, 402, 403, 500, and 600 described above is connected to a capacitor. Also, the semiconductor devices 100, 200, 300, 400, 401, 402, 403, 500, and 600 may be applied to various electronic devices. For example, the semiconductor devices 100, 200, 300, 400, 401, 402, 403, 500, and 600 described above may be used for arithmetic operations, program execution, temporary data retention, and the like in electronic devices, such as mobile devices, computers, laptops, sensors, network devices, and neuromorphic devices.

Figure 13:
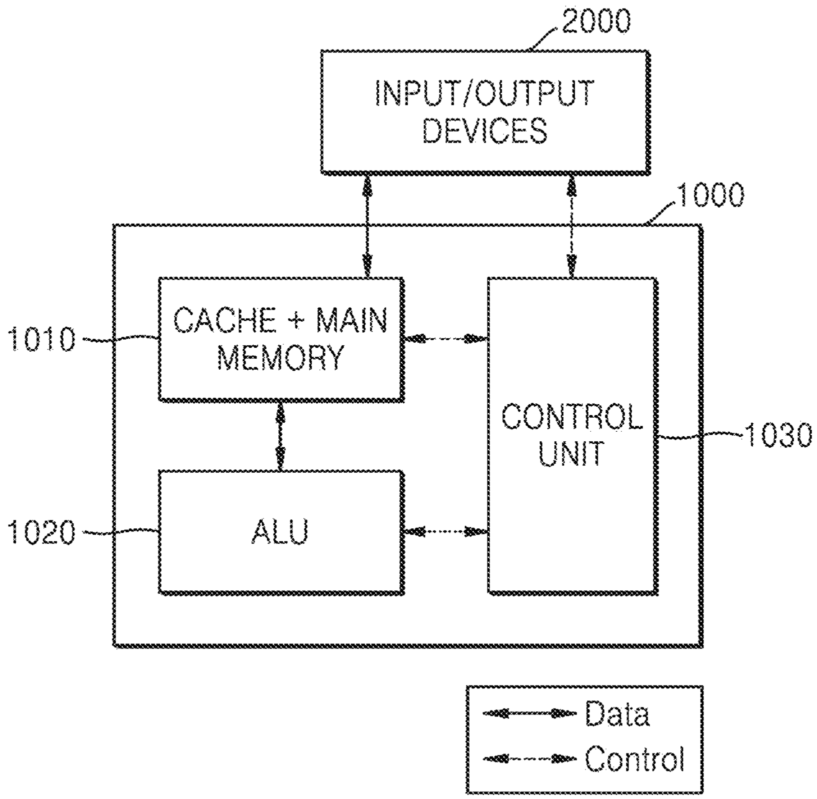
FIGS. 13 and 14 are conceptual diagrams schematically illustrating electronic device architectures applicable to an electronic device, according to an embodiment.
Figure 14:
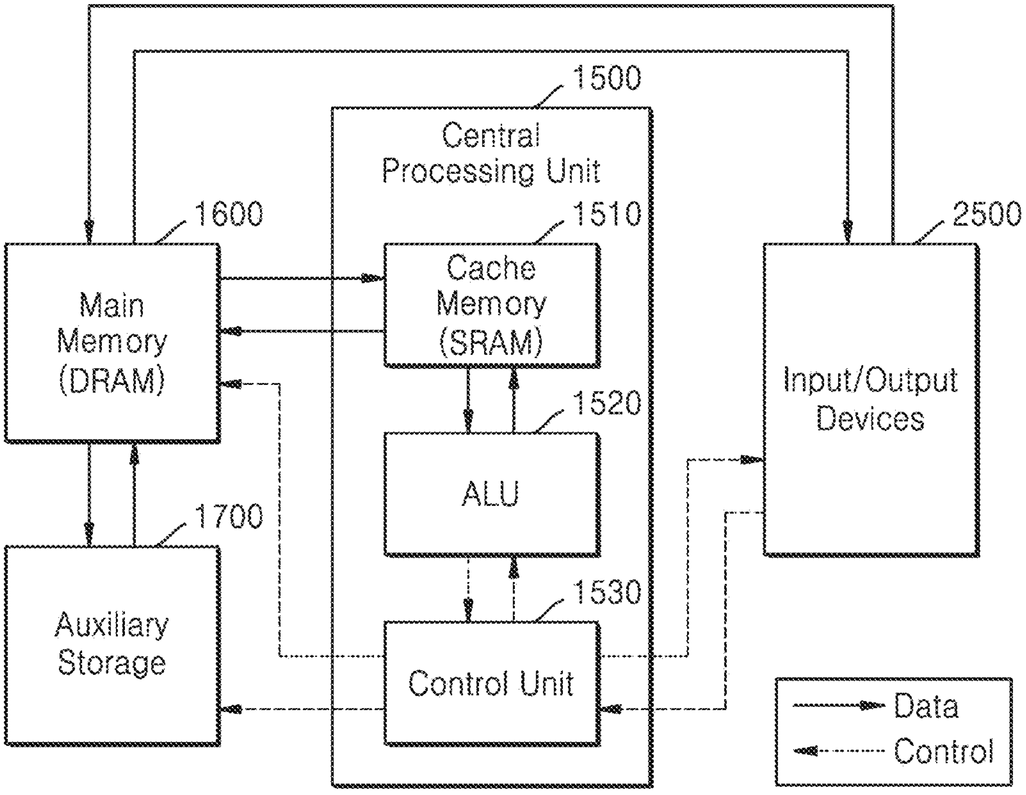

FIGS. 13 and 14 are conceptual diagrams schematically illustrating electronic device architectures applicable to an electronic device, according to an embodiment.

Referring to FIG. 13, an electronic device architecture 1000 may include a memory unit 1010, an arithmetic logic unit (ALU) 1020, and a control unit 1030. The memory unit 1010, the ALU 1020, and the control unit 1030 may be electrically connected to each other. For example, the electronic device architecture 1000 may be implemented as a single chip including the memory unit 1010, the ALU 1020, and the control unit 1030.

Specifically, the memory unit 1010, the ALU 1020, and the control unit 1030 may be interconnected to each other via metal lines in an on-chip manner and may be configured to perform direct communication. The memory unit 1010, the ALU 1020, and the control unit 1030 may be monolithically integrated on a single substrate to constitute a single chip. Input/output devices 2000 may be connected to the electronic device architecture (chip) 1000.

The ALU 1020 and the control unit 1030 may each independently include the semiconductor devices 100, 200, 300, 400, 401, 402, 403, 500, and 600 described above, and the memory unit 1010 may include the semiconductor devices 100, 200, 300, 400, 401, 402, 403, 500, and 600, a capacitor, or a combination thereof. The memory unit 1010 may include both a main memory and a cache memory. The electronic device architecture (chip) 1000 may be an on-chip memory processing unit.

Referring to the FIG. 14, a cache memory 1510, an ALU 1520, and a control unit 1530 may constitute a central processing unit (CPU) 1500. The cache memory 1510 may include static random access memory (SRAM), and may include the semiconductor devices 100 to 600 described above. Apart from the CPU 1500, the electronic device architecture may include a main memory 1600 and an auxiliary storage 1700. The main memory 1600 may include DRAM.

In some cases, the electronic device architecture may be implemented in a form in which computing unit elements and memory unit elements are adjacent to each other on a single chip, without distinction of sub-units.

Because the semiconductor device according to the embodiment uses the two-dimensional semiconductor material as the channel layer, the semiconductor device may have excellent performance even with a small thickness of 1 nm or less. In addition, a short channel effect may be reduced. Accordingly, the limitation of performance degradation due to the reduction in the size of the semiconductor device may be overcome.

In addition, in the semiconductor device according to the embodiment, because the metallic nanoparticles are selectively deposited on the two-dimensional material layer constituting the channel layer, charges may be moved through the metallic nanoparticles, and thus, the electrical conductivity of the two-dimensional material layer may be improved. Accordingly, the contact resistance may increase in the source and drain regions of the two-dimensional material layer, and on-current may be improved due to a decrease in channel resistance in the channel region of the two-dimensional material layer. Also, the doping degree of the two-dimensional material layer may be controlled by adjusting the material type and/or the deposition amount of the metallic nanoparticles selectively deposited on the two-dimensional material layer. Accordingly, the channel polarity, threshold voltage, on-current, off-current, and the like of the semiconductor device may be controlled. Although the embodiments have been described above, this is only an example and various modifications may be made thereto by those of ordinary skill in the art.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
- a two-dimensional material layer including a two-dimensional semiconductor material having a polycrystalline structure;
- metallic nanoparticles partially on the two-dimensional material layer;
- a source electrode and a drain electrode respectively on both sides of the two-dimensional material layer; and
- a gate insulating layer and a gate electrode on the two-dimensional material layer between the source electrode and the drain electrode,
- wherein the metallic nanoparticles comprise Ru, RuO, Mo, W, TiN, or Ti.

2. The semiconductor device of claim 1, wherein the metallic nanoparticles are on at least one of a defect of the two-dimensional semiconductor material and a grain boundary of the two-dimensional semiconductor material.

3. The semiconductor device of claim 1, wherein the two-dimensional semiconductor material comprises a material having a bandgap of 0.1 eV or more and 3.0 eV or less.

4. The semiconductor device of claim 1, wherein the two-dimensional semiconductor material comprises a transition metal dichalcogenide (TMD) or black phosphorus.

5. The semiconductor device of claim 1, wherein
- the two-dimensional material layer comprises a first region and a second region,
- the gate electrode is on the first region of the two-dimensional material layer,
- the source electrode and the drain electrode are on the second region of the two-dimensional material layer.

6. The semiconductor device of claim 5, wherein the metallic nanoparticles are on the first region of the two-dimensional material layer and the second region of the two-dimensional material layer at a substantially uniform density.

7. The semiconductor device of claim 5, wherein the metallic nanoparticles are on the second region of the two-dimensional material layer at a higher density than a density of the metallic nanoparticles on the first region of the two-dimensional material layer.

8. The semiconductor device of claim 5, wherein the metallic nanoparticles are only on the second region of the two-dimensional material layer.

9. The semiconductor device of claim 5, wherein
- the metallic nanoparticles comprise first metallic nanoparticles and second metallic nanoparticles,
- the first metallic nanoparticles are on the first region of the two-dimensional material layer,
- the second metallic nanoparticles are on the second region of the two-dimensional material layer,
- a material of the second metallic nanoparticles is different from a material of the first metallic nanoparticles.

10. The semiconductor device of claim 1, wherein the metallic nanoparticles comprise a material having a work function greater than a work function of the two-dimensional semiconductor material.

11. The semiconductor device of claim 1, wherein the metallic nanoparticles comprise a material having a work function less than a work function of the two-dimensional semiconductor material.

12. A method of fabricating a semiconductor device, the method comprising:
- forming a two-dimensional material layer on a substrate, the two-dimensional material layer including a two-dimensional semiconductor material having a polycrystalline structure;
- depositing metallic nanoparticles on the two-dimensional material layer;
- forming a gate insulating layer and a gate electrode on the two-dimensional material layer; and
- forming a source electrode and a drain electrode on both sides of the two-dimensional material layer, respectively,
- wherein the metallic nanoparticles comprise Ru, RuO, Mo, W, TiN, or Ti.

13. The method of claim 12, wherein the metallic nanoparticles are selectively deposited on at least one of a defect of the two-dimensional semiconductor material and a grain boundary of the two-dimensional semiconductor material.

14. The method of claim 12, wherein
- the two-dimensional material layer comprises a first region and a second region,
- the gate electrode is on the first region of the two-dimensional material layer, and
- the source electrode and the drain electrode are on the second region of the two-dimensional material layer.

15. The method of claim 14, wherein the metallic nanoparticles are deposited on the first region of the two-dimensional material layer and the second region of the two-dimensional material layer at a substantially uniform density.

16. The method of claim 14, wherein the metallic nanoparticles are deposited on the second region of the two-dimensional material layer at a higher density than a density in which the metallic nanoparticles are deposited on the first region of the two-dimensional material layer.

17. The method of claim 14, wherein
- the metallic nanoparticles comprise first metallic nanoparticles and second metallic nanoparticles,
- the first metallic nanoparticles are deposited on the first region of the two-dimensional material layer, the second metallic nanoparticles are deposited on the second region of the two-dimensional material layer, and a material of the second metallic nanoparticles is different from a material of the first metallic nanoparticles.

18. The semiconductor device of claim 1, wherein the metallic nanoparticles comprise Ru, RuO, Mo, or W, and the two-dimensional material layer has a p-type channel polarity.

19. The semiconductor device of claim 1, wherein the metallic nanoparticles comprise TiN or Ti, and the two-dimensional material layer has an n-type channel polarity.

20. The semiconductor device of claim 12, wherein the depositing of the metallic nanoparticles does not uniformly cover the two-dimensional material layer.

* * * * *